(12) United States Patent
Itzler

(10) Patent No.: US 8,133,755 B2
(45) Date of Patent: Mar. 13, 2012

(54) AVALANCHE PHOTODIODE HAVING CONTROLLED BREAKDOWN VOLTAGE

(75) Inventor: Mark Allen Itzler, Princeton, NJ (US)

(73) Assignee: Princeton Lightwave, Inc., Cranbury, NJ (US)

( * ) Notice: Subject to any disclaimer, the term of this patent is extended or adjusted under 35 U.S.C. 154(b) by 0 days.

(21) Appl. No.: 13/237,546

(22) Filed: Sep. 20, 2011

(65) Prior Publication Data

US 2012/0009727 A1  Jan. 12, 2012

Related U.S. Application Data

(60) Division of application No. 12/243,488, filed on Oct. 1, 2008, now Pat. No. 8,044,436, which is a continuation-in-part of application No. 11/682,999, filed on Mar. 7, 2007, now Pat. No. 7,964,435.

(51) Int. Cl.
    *H01L 21/00* (2006.01)
(52) U.S. Cl. ............... 438/91; 438/380; 438/552
(58) Field of Classification Search .......... 438/91, 438/380, 552
    See application file for complete search history.

(56) References Cited

U.S. PATENT DOCUMENTS

| 6,015,721 | A  | 1/2000 | Kim          |
|-----------|----|--------|--------------|
| 2006/0081874 | A1 | 4/2006 | Francis et al. |
| 2006/0121683 | A1 | 6/2006 | Francis et al. |

FOREIGN PATENT DOCUMENTS

EP  1679749 A1  7/2006

OTHER PUBLICATIONS

Liu et al., "Simple, very low dark current, planar long-wavelength avalanche photodiode", "Applied Physics Letters", Oct. 3, 1988, pp. 1311-1313, vol. 53, No. 14, Publisher: American Institute of Physics, Published in: US.
Chaudhari, Chandra P., "U.S. Appl. No 11/682,999 Notice of Allowance Feb. 16, 2011", , Publisher: USPTO, Published in US.
Doyle, John, "U.S. Appl. No. 11/682,999 Office Action Jun. 30, 2009", , Publisher: USPTO, Published in: US.
Chaudhari, Chandra P., "U.S. Appl. No. 11/682,999 Office Action Sep. 2, 2010", , Publisher: USPTO, Published in: US.
Chaudhari, Chandra P., "U.S. Appl. No. 11/682,999 Restriction Requirement May 12, 2010", , Publisher: USPTO, Published in: US.
Menz, Douglas M., "U.S. Appl. No. 12/243,488 Office Action Mar. 18, 2011", , Publisher: USPTO, Published in: US.
Menz, Douglas M., "U.S. Appl. No. 12/243,488 Office Action Sep. 20, 2010", , Publisher: USPTO, Published in: US.
Chaudhari, Chandra P., "U.S. Appl. No. 12/243,488 Restriction Requirement May 3, 2010", , Publisher: USPTO, Published in: US.

*Primary Examiner* — Douglas Menz
(74) *Attorney, Agent, or Firm* — DeMont & Breyer, LLC

(57) ABSTRACT

Avalanche photodiodes and methods for forming them are disclosed. The breakdown voltage of an avalanche photodiode is controlled through the inclusion of a diffusion sink that is formed at the same time as the device region of the photodiode. The device region and diffusion sink are formed by diffusing a dopant into a semiconductor to form a p-n junction in the device region. The dopant is diffused through a first diffusion window to form the device region and a second diffusion window to form the diffusion sink. The depth of the p-n junction is based on an attribute of the second diffusion window.

19 Claims, 6 Drawing Sheets

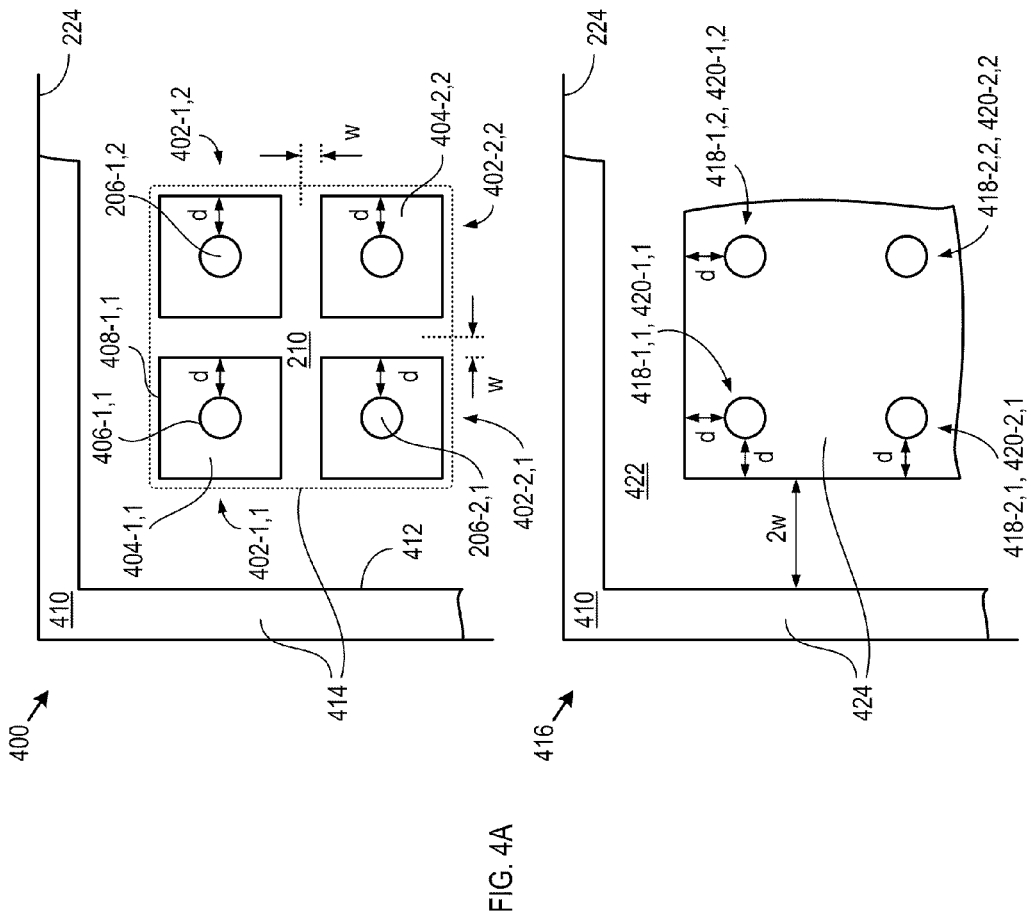

AVALANCHE PHOTODIODE HAVING CONTROLLED BREAKDOWN VOLTAGE

CROSS REFERENCE TO RELATED APPLICATIONS

This case is a divisional application of co-pending U.S. patent application Ser. No. 12/243,488 filed Oct. 1, 2008, which is a continuation-in-part of U.S. patent application Ser. No. 11/682,999 filed 7 Mar. 2007 (now U.S. Pat. No. 7,964, 435), each of which is incorporated by reference herein.

FIELD OF THE INVENTION

The present invention relates to avalanche photodiodes in general and, more particularly, to control of the breakdown voltage of an avalanche photodiode.

BACKGROUND OF THE INVENTION

Avalanche photodiodes (APDs) are photodiodes that can generate a relatively large electrical current signal in response to the receipt of a relatively low-power optical signal (i.e., APDs have high responsivity). A typical APD includes a first semiconductor layer (an absorption layer) in which light energy is absorbed to create free charge carriers and a second semiconductor layer that contains a multiplication region, which is a region in which free charge carriers multiply to create a detectable electrical current.

In operation, an APD is "biased" by applying a voltage across the APD to create a high electric field. Free electrical carriers generated in the absorption layer are injected into the multiplication region. In the multiplication region, the free carriers are accelerated to a velocity that enables them to create more free carriers through a process called "impact ionization." The resultant additional free carriers are also accelerated by the electric field and create even more free carriers, and so on. This process is referred to as avalanche multiplication, and is responsible for the high responsivity of an APD.

An APD is characterized by a breakdown voltage. The breakdown voltage of an APD is the voltage at which the APD is sufficiently electrically-biased to conduct a large current arising from a self-sustaining avalanche process that occurs in its multiplication region—even in the absence of continuous optical power. Typically, an APD is operated in one of two modes. In linear mode operation, the APD is biased slightly below the breakdown voltage, with consequent gains being modest and substantially proportional to the intensity of the incident light. In Geiger mode, the APD is biased slightly above its breakdown voltage with the specific intent of generating very large avalanches that allow for the detection of single photons.

Breakdown voltage is a critical device parameter for an APD. Unfortunately, APD breakdown voltage is highly dependent upon its layer structure and the properties of the semiconductor layers of which it is formed. These factors have historically been extremely difficult to control from wafer to wafer, fabrication run to fabrication run, and even across a single wafer within a run. Local variations in process parameters, such as temperature and/or gas flow, can lead to significant variations in the breakdown voltage across a wafer of APD structures.

While it is possible to adjust for a variation in expected breakdown voltage for a single APD, it can be quite complex and costly to measure and compensate for individual breakdown voltages within an array of such devices. For applications in which a plurality of APDs is required, such as in imaging sensors, position sensors, etc., the impact of breakdown voltage variation is, therefore, particularly damaging. Such variation necessitates costly inspection methods, complex control circuitry, increased cost, and often a degradation of the performance of the APD array.

SUMMARY OF THE INVENTION

The present invention discloses APDs and APD arrays, and methods for forming them, wherein the breakdown voltage of the APDs is controlled by controlling the depth of a p-n junction that defines the device region of the APD. The present invention takes advantage of a relationship between the diffusion depth at a first location and the inclusion of a diffusion sink at a second location. Specifically, the depth to which a dopant diffuses through a first window at the first location can be controlled by controlling an attribute of a second diffusion window located at the second location. This relationship was first disclosed in U.S. patent application Ser. No. 11/682,999 filed 7 Mar. 2007, of which the instant application is a continuation-in-part.

In the prior-art, the p-n junction that defines the device region of an APD is formed by diffusing dopant atoms through a first diffusion window in a diffusion mask. The first diffusion window exposes a semiconductor "cap layer" in the device region. During the diffusion process, dopant atoms incident on the exposed cap layer in the first diffusion window diffuse into the cap layer to a depth based on process conditions and the amount of dopant atoms available. The diffusion process also deposits dopant atoms on the mask layer material outside of the first diffusion window, however. Some fraction of these dopant atoms will migrate along the surface of the diffusion mask material until they reach the first diffusion window. As a result, this surface migration increases the amount of dopant available for diffusion into the cap layer in the device region. The depth of the p-n junction formed in the device region, therefore, is increased due to the higher dopant concentration at the first diffusion window. Since the surface diffusion process is uncontrolled, it contributes significantly to variations in the breakdown voltages across a wafer of fabricated APDs.

In contrast to the prior art, the present invention utilizes a diffusion mask that comprises a first diffusion window for forming a device region, as well as a second diffusion window for forming a diffusion sink within the vicinity of the device region. The presence of the second diffusion window limits the amount of additional dopant made available to the first diffusion window by surface diffusion. As a result, the variation of breakdown voltage across a wafer of fabricated APDs is mitigated. In some embodiments, an attribute of the second diffusion window (e.g., a window dimension, separation between the first diffusion window and the second diffusion window) is controlled to affect the breakdown voltage of an APD.

Embodiments of the present invention comprise an APD that includes a diffusion region comprising a device region and a diffusion sink. The diffusion region is formed by diffusing a dopant through a diffusion mask having a first diffusion window for forming the device region and a second diffusion window for forming the diffusion sink. The breakdown voltage of the APD is based on an attribute of the second diffusion window. In some embodiments, the attribute is a dimension, such as width, of the second diffusion window. In some embodiments, the attribute is a separation between the first diffusion window and the second diffusion window. Neglecting lateral diffusion, therefore, in some embodiments the breakdown voltage is based on a dimension of the diffusion sink and/or the separation between the device area and the diffusion sink.

Embodiments of the present invention comprise a plurality of APDs whose breakdown voltages are controlled to be substantially uniform. Each of the plurality of APDs has a substantially identical device structure that includes a device region whose p-n junction has a depth that is based on the inclusion of a nearby diffusion sink. The p-n junction is formed using a diffusion mask that includes a first diffusion window for forming the p-n junction and a second diffusion window for forming the diffusion sink. In some embodiments, the second diffusion window of each APD has a dimension that is the same size. In some embodiments, each APD includes a first diffusion window and a second diffusion window that are separated by the same minimum separation distance.

Embodiments of the present invention comprise a first APD and a second APD, wherein the first APD is characterized by a first breakdown voltage and the second APD is characterized by a second breakdown voltage. The first and second APDs each include a second diffusion window; however, an attribute of the second diffusion window of each APD is different so as to result in the desired breakdown voltage difference between the two APDs.

An embodiment of the present invention comprises a first APD, wherein the first APD comprises: a first diffusion region that is doped with a first dopant, wherein the first diffusion region comprises a first device region and a first diffusion sink; wherein the first device region and the first diffusion sink are non-contiguous, and further wherein the diffusion depth in the first device region is based on a first attribute of the first diffusion sink.

BRIEF DESCRIPTION OF THE DRAWINGS

FIG. 4A depicts a schematic diagram of a details of a portion of a APD array in accordance with a first alternative embodiment of the present invention.

FIG. 4B depicts a schematic diagram of a details of a portion of a APD array that is not characterized by a diffusion sink in close proximity to each device region of the array.

DETAILED DESCRIPTION

Figure 1:
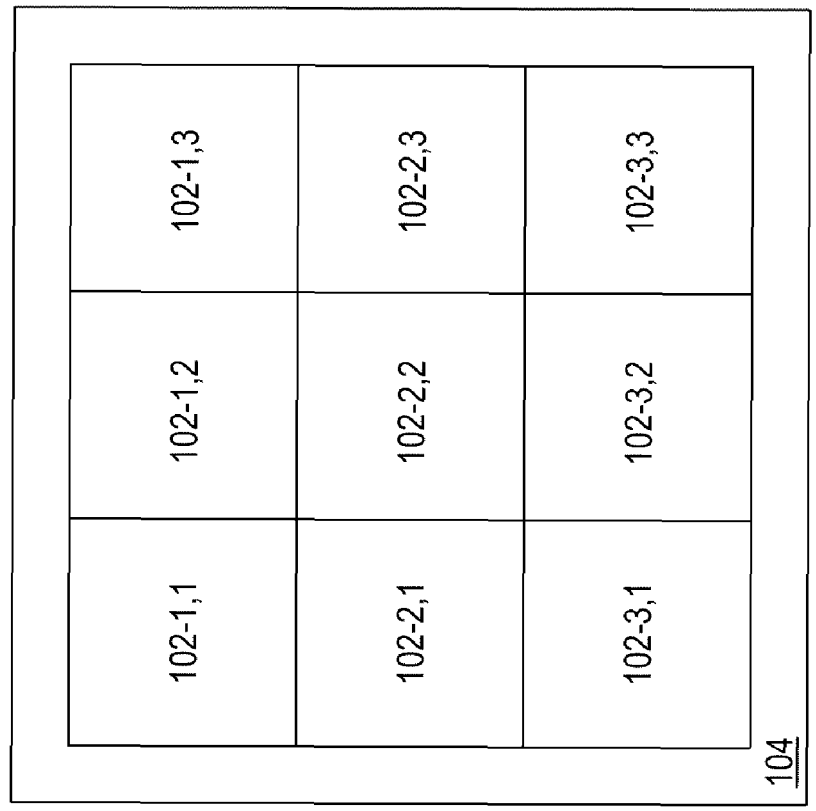
FIG. 1 depicts a schematic drawing of a APD array in accordance with an illustrative embodiment of the present invention.

As discussed in detail in U.S. patent application Ser. No. 11/682,999, for a given diffusion process, the depth to which dopant atoms diffuse into a first region of a semiconductor through a first diffusion window can be affected by the presence of a second diffusion window located nearby. Specifically, the diffusion depth in the first region can be controlled through control of:

i. a size of the second diffusion window; or
    ii. a separation between the first diffusion window and the second diffusion window; or
    iii. both i and ii.

The relationship between the presence of the second diffusion window and the depth of diffusion in the first region was found through experimentation. Results from these experiments have been interpreted as follows. Dopant atoms on the surface of the diffusion mask are mobile and randomly migrate on the surface via surface diffusion. When a dopant atom arrives at an unmasked portion of the semiconductor surface, there is a finite probability that it will diffuse into the bulk of the semiconductor material. If a relatively greater fraction of the semiconductor surface is masked, a relatively greater amount of dopant is available for doping those portions of the surface that are unmasked. Conversely, if a relatively greater fraction of the semiconductor surface is not masked, a relatively lesser amount of dopant is available for doping those unmasked portions. At the limit, if none of the semiconductor surface is masked, dopant penetrates the entire surface uniformly. This situation defines the minimum diffusion depth possible for a given set of process parameters (i.e., temperature, dopant flow rate, ambient pressure, etc.).

From the foregoing interpretation, the underlying principles of the invention disclosed in the parent application were developed. In particular, when most of the surface of a wafer is masked, substantial variations in diffusion depth can be introduced for different-sized devices (i.e., different-sized diffusion windows). Furthermore, for devices of identical sizes, different diffusion depths can be achieved by appropriately tailoring the amount of masked surface area (e.g., via a diffusion sink, etc.) in the vicinity of the area to be diffused. These principles, and permutations thereof, were found to provide new ways to control a dopant diffusion process.

The present invention discloses specific embodiments of APDs and APD arrays, and methods for forming them, wherein the breakdown voltage of each of the APDs is controlled by including a diffusion sink to control the p-n junction depth in the APD's device region.

The junction depth is controlled by forming a diffusion region that includes both the device region of the APD and a diffusion sink, wherein the diffusion sink is characterized by an attribute that affects the diffusion depth in the device region. In some embodiments, this attribute is a dimension of the diffusion sink, such as width, etc. In some embodiments, this attribute is a separation distance between the diffusion windows used to form the device region and diffusion sink. For the purposes of this Specification, including the appended claims, the term "diffusion region" means a region of semiconductor that is doped during the same diffusion process. In some instances, a diffusion region comprises a plurality of distinct, non-contiguous regions within it (e.g., a device region and a diffusion sink); however, these distinct non-contiguous regions are doped at the same time during the same diffusion process.

In many applications, such as single-photon detection, an APD is electrically biased above breakdown. Breakdown voltage is, therefore, an important design parameter for these and other types of APDs. But a primary design consideration for a APD will typically be an operational characteristic, such as multiplication gain, operating speed, noise level, dark current, etc. This characteristic is a function of the application for the APD. Knowing the particular application and having decided upon an operational characteristic, those skilled in the art will be able to calculate what the breakdown voltage ought to be to produce a APD that exhibits the desired operational characteristic.

For a given APD structure (e.g., materials, layer thicknesses, layer doping, etc.), the chief determinant of breakdown voltage is depth of the p-n junction of the APD's device region. The depth of this p-n junction is determined by the diffusion depth of the dopant that is diffused to form the device region. There is, in fact, a well-understood relationship between breakdown voltage and dopant depth in the device region; one can be calculated knowing the other (and other specifics of the opto-electronic device). Over a wide range of diffusion depth, the deeper that dopant diffuses into the semiconductor material that forms an APD's cap layer, the lower the breakdown voltage of the APD. It is this parameter—the depth to which dopant is diffused into the semiconductor—that is actually controlled to form a APD having the desired breakdown voltage and, hence, the desired operating characteristic.

Due to variations in temperature across a wafer, localized mass transport phenomena, loading effects, etc., the depth to which a dopant diffuses into a semiconductor layer is typically quite non-uniform across a wafer surface. In many cases, breakdown voltage variations are not a major issue—particularly where APDs are singulated from the wafer and used individually. In many applications, however, uniform breakdown voltage across a APD array is critical. Examples of such applications include imaging sensors, pixilated detectors, quadrant detectors, position sensors, grouped detectors, object tracking sensors, and the like. Further, in some applications it is advantageous to apply a controlled variation in breakdown voltage across an array to, for example, counter-act other device differences that might arise due to processing variations, material variations, etc.

FIG. 1 depicts a schematic drawing of a APD array in accordance with an illustrative embodiment of the present invention. APD array 100 comprises pixels 102-1,1 through 102-3,3 (collectively referred to as pixels 102), which are formed on substrate 104.

Each of pixels 102 comprises a APD whose breakdown voltage is controlled to be substantially equal to a desired breakdown voltage. In other words, APD array 100 is characterized by a uniform breakdown voltage.

Although the illustrative embodiment comprises a APD array comprising a two-dimensional regular array of nine APDs, it will be clear to one skilled in the art, after reading this specification, how to specify, make, and use alternative embodiments of the present invention that comprise any number of APDs that are arranged in any configuration. Further, it will be clear how to make, and use an APD array in which at least one APD of the array is characterized by a breakdown voltage that is controlled to differ from the breakdown voltage of at least one other APD of the array.

In some embodiments, each of pixels 102 comprises read-out circuitry, such as that included in a typical read-out integrated circuit.

Figure 2A:
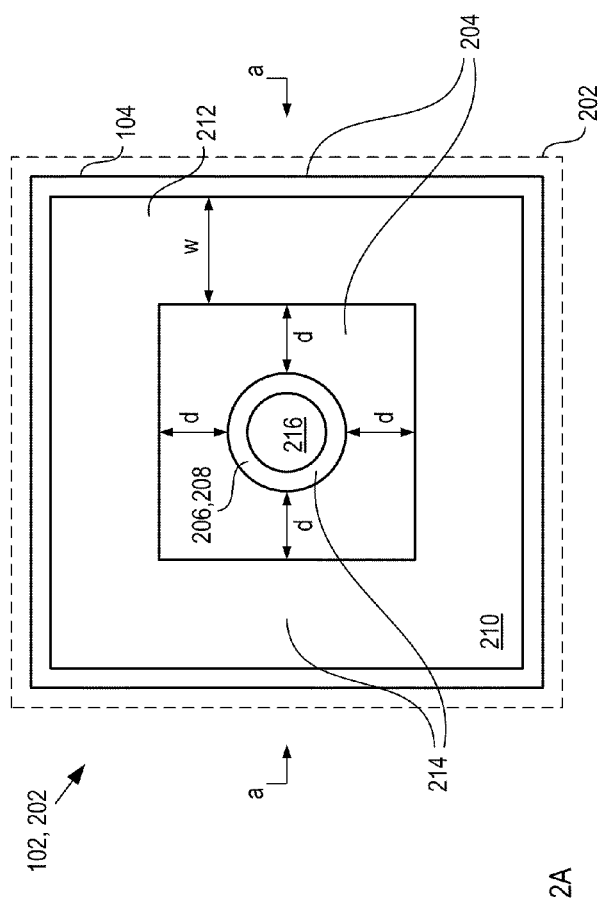
FIG. 2A depicts a top view of a representative pixel 102 in accordance with the illustrative embodiment of the present invention.
Figure 2B:
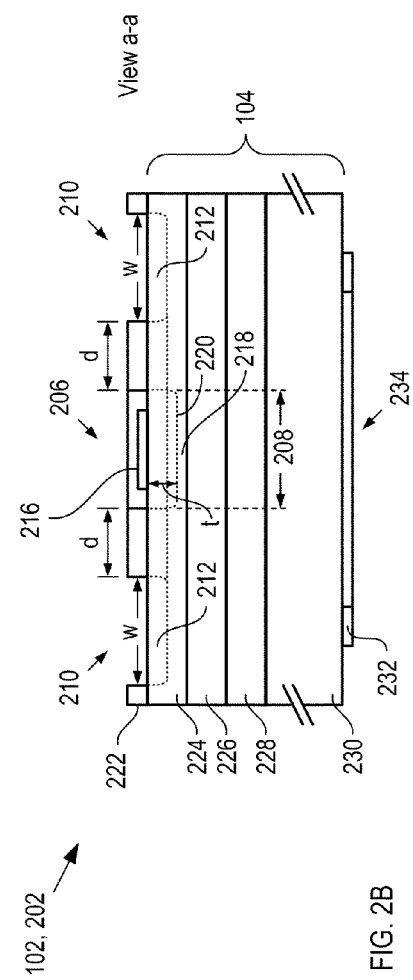
FIG. 2B depicts a cross-sectional view of a representative pixel 102 in accordance with the illustrative embodiment of the present invention.

FIGS. 2A and 2B depict a top view and cross-sectional view, respectively, of a representative pixel 102, in accordance with the illustrative embodiment of the present invention. Pixel 102 is representative of each of pixels 102-1,1 through 102-3,3 and comprises APD 202.

APD 202 is an APD suitable for providing a photocurrent in response to the receipt of light within the range of approximately 0.9 microns to approximately 1.7 microns (i.e., the short-wave infrared (SWIR) wavelength range). In some embodiments, APD 202 operates at wavelengths other than the short-wave infrared, such as visible light, near-infrared, midwave infrared, or longwave infrared. APD 202 comprises device region 208 and diffusion sink 212, which are formed in cap layer 224 of substrate 104. In some embodiments, APD 202 is physically adapted for operation as a single-photon detector.

Substrate 104 comprises bulk substrate 230, absorption layer 228, charge control layer 226, and cap layer 224. Bulk substrate 230 is a semiconductor substrate suitable for supporting the formation of a SWIR APD. In some embodiments, substrate 230 comprises a buffer layer that interposes bulk substrate 230 and absorption layer 228. It will be clear to one skilled in the art how to specify, make, and use substrate 104, wherein substrate 104 is suitable for the formation of a APD operative for light having any practical wavelength.

Charge control layer 226 is a moderately n-doped layer of indium phosphide. Charge control layer 226 enables maintenance of a low electric field in absorption layer 228, while supporting a high electric field in cap layer 224. It will be clear to those skilled in the art how to make and use charge control layer 226.

Absorption layer 228 absorbs the optical energy of an optical beam incident upon optical window 234, and generates electrical carriers. In some embodiments, absorption layer 228 is an intrinsic layer of indium gallium arsenide. It will be clear to those skilled in the art how to make and use absorption layer 228.

Cap layer 224 is a lightly n-doped layer of indium phosphide. As used herein, the terms "lightly n-doped" and "lightly p-doped" refer to the intentional doping of a semiconductor layer with an n-type or p-type dopant to a dopant concentration of less than three orders of magnitude greater than the background concentration of the semiconductor layer. Within cap layer 224 is device region 208 which includes a heavily doped p-type region. Device region 208 is formed by diffusing a p-type dopant into cap layer 224 to form p-n junction 220. The lateral extent of p-n junction 220 defines the lateral extent of device region 208. The undoped portion of device region 208 (i.e., the region beneath p-n junction 220) forms avalanche multiplication region 218, which is a high-field multiplication region in which avalanche multiplication occurs.

In operation, SWIR light incident on optical window 234 is absorbed in absorption layer 228. The energy of the absorbed light generates free charge carriers (i.e., electrons and holes). A reverse bias voltage applied between contacts 216 and 232 creates an electric field across cap layer 224, charge control layer 226, and absorption layer 228 that accelerates free charge carriers into multiplication region 218. Within multiplication region 218, the free carriers reach a velocity at which impact ionization can occur. Impact ionization results in the generation of additional free carriers. The resultant free electrons and holes are likewise accelerated and create new electron-hole pairs, and so forth. The net result is that the APD exhibits internal "multiplication gain", thereby providing a larger output photocurrent than a photodiode without internal gain. At sufficiently high applied voltage, a breakdown occurs in which the gain diverges, with the associated reverse current increasing extremely rapidly with small incremental increases in reverse bias voltage.

APD 202 is characterized by a breakdown voltage that is determined by the depth, t, of p-n junction 220 within cap layer 224, as discussed above. The depth of p-n junction 224 is, in turn, controlled by the presence of diffusion sink 212.

Figure 3:
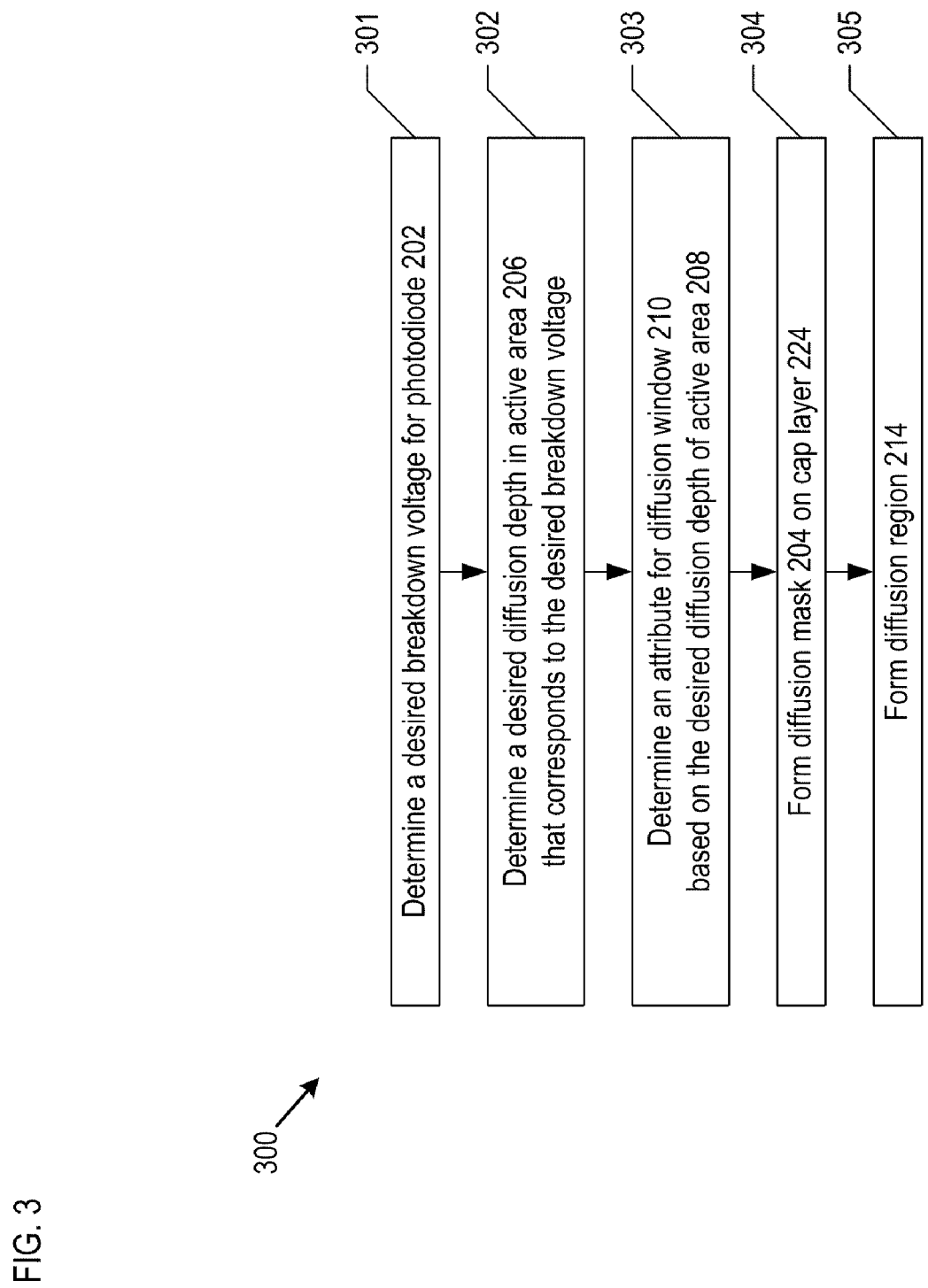
FIG. 3 depicts a method comprising operations suitable for the formation of APD 202 in accordance with the illustrative embodiment of the present invention.

FIG. 3 depicts a method comprising operations suitable for the formation of APD 202 in accordance with the illustrative embodiment of the present invention. Method 300 is described herein with continuing reference to FIGS. 1, 2A, and 2B. Method 300 begins with operation 301, wherein a desired breakdown voltage for APD 202 is determined. The desired breakdown voltage is dependent upon specifics of the application for which APD 202 is used, and it will be clear to one skilled in the art how to determine the desired breakdown voltage for APD 202.

At operation 302, a desired diffusion depth for p-n junction 220 in device region 208 is determined, based upon the desired breakdown voltage. As discussed above, for a given APD structure, a well-understood relationship between breakdown voltage and p-n junction depth exists. Diffusion depth in device region 208, therefore, can be readily determined once a desired breakdown voltage is known.

At operation 303, the desired diffusion depth, t, in device region 208 (i.e., the depth of p-n junction 220) is used to determine an attribute for diffusion window 210—specifically, a separation, d, between diffusion window 206 and diffusion window 210. In some embodiments, the desired diffusion depth is used to determine a dimension of diffusion window 210, such as diffusion window width, w. In some embodiments, the desired diffusion depth is used to determine both a dimension of diffusion window 210 and a separation between diffusion window 206 and diffusion window 210.

At operation 304, diffusion mask 204 is formed on cap layer 224. Diffusion mask 204 is formed by depositing mask layer 222 on cap layer 224 using conventional deposition techniques. Mask layer 222 comprises a material that inhibits the diffusion of the dopant used to form device region 208 into cap layer 224. Suitable mask layer materials include, without limitation, silicon nitride, silicon dioxide, silicon oxynitrides, glasses, polymers, photoresists, metals, and the like. It will be clear to those skilled in the art how to make and use a diffusion mask.

Mask layer 222 is patterned using conventional photolithography and etching techniques to form diffusion mask 204, which comprises diffusion windows 206 and 210. As a result, cap layer 224 is made accessible to dopant atoms in the regions of diffusion windows 206 and 210. In the illustrative embodiment: diffusion window 206 is a circular opening having a diameter of approximately 30 microns; diffusion window 210 is a square annulus with a width, w, of approximately 10 microns; and diffusion windows 206 and 210 are separated by a minimum separation, d, of approximately 35 microns. In some embodiments, the diameter of diffusion window 206 is within the range of approximately 5 microns to approximately 100 microns. In some embodiments, the width of diffusion window 210 is within the range of approximately 1 micron to approximately 50 microns. In some embodiments, the minimum separation, d, between diffusion window 206 and diffusion window 210 is within the range of approximately 2 microns to approximately 50 microns.

In some embodiments, the width of diffusion window 210 extends to the extent of pixel 102. As a result, the diffusion windows 210 of two adjacent pixels are contiguous and thereby form a continuous diffusion sink 212. For example, in such embodiments, diffusion window 210-1,1 and 210-1,2 would collectively define a single diffusion window that interposes device regions 208-1,1 and 208-1,2. In some embodiments, the shape of diffusion window 210 is other than a square annulus, such as a circular annulus, a rectangular, an ellipse, an arc, and the like.

At operation 305, a suitable p-type dopant (e.g., zinc, cadmium, etc.) is diffused into cap layer 224 through diffusion windows 206 and 210 to form diffusion region 214. Diffusion region 214 comprises device region 208 and diffusion sink 212. It should be noted that, due to some lateral diffusion during the formation of device region 208 and diffusion sink 212, the lateral extent of device region 208 and diffusion sink 212 typically extends beyond the perimeters of diffusion windows 206 and 210. For the purposes of this Specification, including the appended claims, however, the affect of lateral diffusion is not considered relevant. As a result, in the instant application, a diffused region and the diffusion window used to form it are considered to have the same dimensions and position. Further, the separation between two diffused regions is considered to be equivalent to the separation between the diffusion windows used to form them.

Subsequent to the formation of device region 208, contacts 216 and 232 are formed in conventional fashion. In addition, an anti-reflection coating is disposed on optical window 234 to reduce back-reflection of incident light and improve detection efficiency of APD 202.

FIG. 4A depicts a schematic diagram of a details of a portion of an APD array in accordance with a first alternative embodiment of the present invention. APD array 400 comprises a 32×32 array of pixels, each of which comprises one of APDs 402-1,1 through 402-32,32 (collectively referred to as APDs 402). APD 402 is analogous to APD 202.

Like APD 202, each APD 402 is formed by diffusing a suitable dopant through a diffusion mask (i.e., diffusion mask 414). In the case of APD 402, diffusion mask 414 comprises mask regions 404-1,1 through 404-32,32 (collectively referred to as mask regions 404) and edge region 410.

Each mask region 404 comprises diffusion window 206 and outer perimeter 408. Diffusion window 206 is defined by inner perimeter 406. Inner perimeter 406 and outer perimeter 408 are separated by a minimum separation distance, d. Outer perimeters 408-1,1 through 408-32,32 and the perimeter 412 of edge region 410 collectively define continuous diffusion window 210, which surrounds each diffusion window 206. Diffusion window 210 also interposes each pair of diffusion window 206 with a region having a width equal to 2w. As with APD 202, a suitable dopant is diffused through diffusion windows 206 and 210 to form the device regions 208-1,1 through 208-32,32, and diffusion sink 212. For clarity, the device regions, diffusion sinks, and electrical contacts of APDs 402 are not shown. As described above and with respect to FIGS. 2A and 2B, device regions 208 and diffusion sink 212 are typically slightly larger than diffusion windows 206 and 210 due to slight lateral diffusion.

Exemplary dimensions for APD array 400 include (neglecting lateral diffusion): a device region 206 having a diameter of approximately 30 microns in diameter; a regular pitch in each dimension of approximately 100 microns; and a diffusion sink 212 having a width, w, of approximately 5 microns. In other words, the width of the diffusion sink regions that interpose each pair of device regions is approximately 10 microns in width, and is separated from each device region by a minimum separation distance of approximately 30 microns. The suitable ranges for these dimensions are analogous to those provided above for the illustrative embodiment.

FIG. 4B depicts a schematic diagram of a details of a portion of an APD array that is not characterized by a diffusion sink in close proximity to each device region of the array. APD array 416 comprises a 32×32 array of pixels, each of which comprises one device regions 418-1,1 through 418-32, 32 (collectively referred to as device regions 420). The device regions of APD array 416 are formed by diffusing a suitable dopant through diffusion windows 420-1,1 through 420-32, 32, and have the same size and arrangement as the device regions of APD array 400. In contrast to APD array 400, however, pairs of device regions 418 are not interposed by a diffusion sink region. Instead, APD array 416 includes diffusion sink 422, which is located only around the perimeter of the APD array. As a result, only those device areas on the edges of the APD array are impacted by the presence of diffusion sink 422.

Figure 5A:
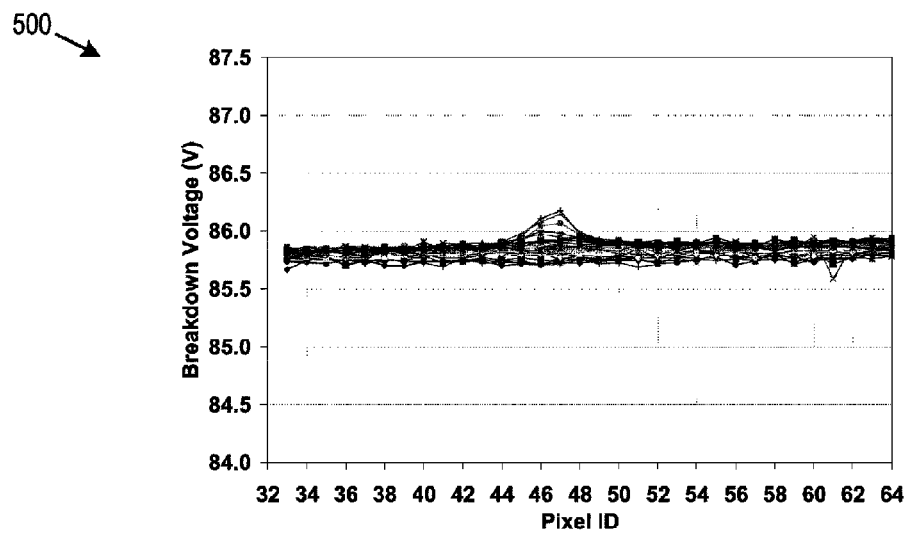
FIG. 5A is a plot of measured breakdown voltages for a APD array in accordance with the first alternative embodiment of the present invention.
Figure 5B:
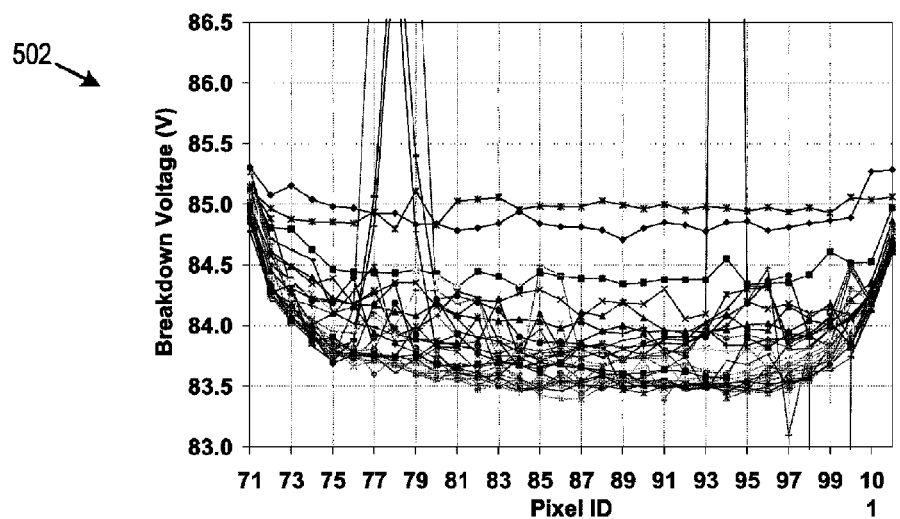
FIG. 5B is a plot of measured breakdown voltages for a APD array of the types depicted in FIG. 4B.

FIGS. 5A and 5B are plots of measured breakdown voltages for APD arrays of the types of APD array 400 and 416, respectively. Plot 500 shows the breakdown voltage of each APD of a 32×32 array of APDs 402. Plot 502 shows the breakdown voltage of each APD of a 32×32 array of APDs 414.

Comparison of the data shown in plots 500 and 502 clearly demonstrates the impact of the inclusion of a diffusion sink near each device region of a APD in the array. For example, the breakdown voltage of nearly every APD in APD array 400 is within a range from approximately 85.7 volts to approximately 85.9 volts (i.e., a distribution of less than approximately 0.25 volts). A minor wafer defect resulted in a small, correlated group of APDs having breakdown voltages slightly outside this range. In contrast, the breakdown voltages for the APDs of APD array 416 vary over a significantly wider range. The breakdown voltages for the APDs of APD array 414 are within the range of approximately 83.45 volts to approximately 85.05 volts (neglecting spurious data points). In other words, the distribution of breakdown voltages for APD array 400 is approximately 0.2 volts, while the distribution of breakdown voltages for APD array 416 is approximately 1.6 volts. For the APD design of APD array 400, therefore, the inclusion of a diffusion sink near each device region resulted in a 8× improvement in uniformity of breakdown voltages.

It is interesting to note that plot 502, in itself, offers further confirmation of the advantageous effect of an included diffusion sink. The breakdown voltages for those APDs at the edges of APD array 416 all fall primarily within a narrow range (i.e., approximately 84.9 volts to approximately 85.2 volts), in similar fashion to those of APD array 400.

Figure 6A:
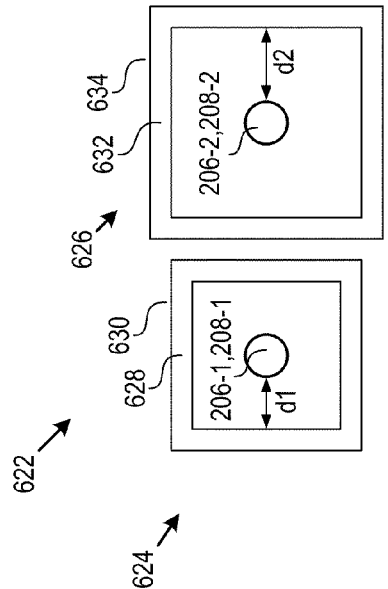
FIG. 6A depicts a schematic diagram of details of a pixel in accordance with a second alternative embodiment of the present invention.

FIG. 6A depicts a schematic diagram of details of a pixel in accordance with a second alternative embodiment of the present invention. Pixel 600 comprises APD 602, which comprises device region 208, diffusion mask 604, and diffusion sink 606.

Diffusion mask 604 is a circular annulus of material that inhibits diffusion of dopant into underlying cap layer 224. Diffusion mask 604 comprises diffusion window 206, which has a diameter of approximately 30 microns. Diffusion window 606 comprises the area of pixel 600 that lies outside the outer perimeter of diffusion mask 604. Diffusion windows 206 and 606 are separated by the annulus of diffusion mask 604, which has a substantially uniform width, d, of approximately 30 microns. Dopant is diffused into cap layer 224 through diffusion windows 206 and 606 to form device region 208 and diffusion sink 608.

Figure 6B:
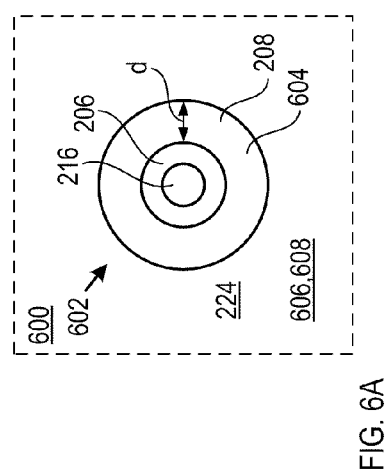
FIG. 6B depicts a schematic diagram of details of a pixel in accordance with a third alternative embodiment of the present invention.

FIG. 6B depicts a schematic diagram of details of a pixel in accordance with a third alternative embodiment of the present invention. Pixel 612 comprises APDs 614-1,1 through 614-2,2 (collectively referred to as APDs 614). Each APD 614 comprises a device region 208 and a portion of diffusion sink 618. APDs 614 are electrically connected in parallel by virtue of contact 232 (not shown) and common contact 620, which electrically connects each device region 208. As a result, pixel 612 generates an output signal in response to light received by any of APDs 614. Since each of diffusion windows 206 is separated from diffusion window 616 by the same minimum separation, d, the breakdown voltages of each of APDs 614 are substantially the same.

Figure 6C:
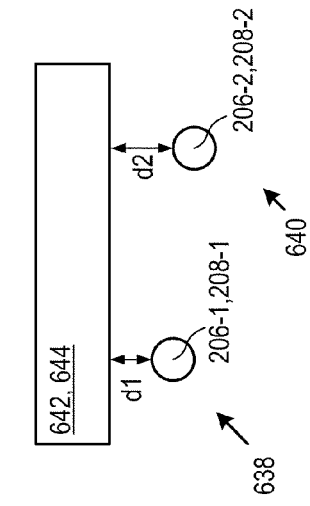
FIG. 6C depicts a schematic diagram of details of a pixel in accordance with a fourth alternative embodiment of the present invention.

FIG. 6C depicts a schematic diagram of details of a pixel in accordance with a fourth alternative embodiment of the present invention. Pixel 622 comprises APDs 624 and 626. APD 624 comprises device region 208-1 and diffusion sink 630, which are formed by diffusing a suitable dopant through diffusion windows 206-1 and 628. Diffusion windows 206-1 and 628 are separated by a minimum distance equal to d1. APD 626 comprises device region 208-2 and diffusion sink 634, which are formed by diffusing a suitable dopant through diffusion windows 206-2 and 632. Diffusion windows 206-2 and 632 are separated by a minimum distance equal to d2. Electrical contacts to APDs 624 and 626 are not shown for clarity. Each of diffusion windows 630 and 634 is separated from diffusion windows 206-1 and 206-2, respectively, by a different minimum separation. As a result, the breakdown voltages of APDs 622 and 626 are controlled to be different by an amount based on that difference.

Figure 6D:
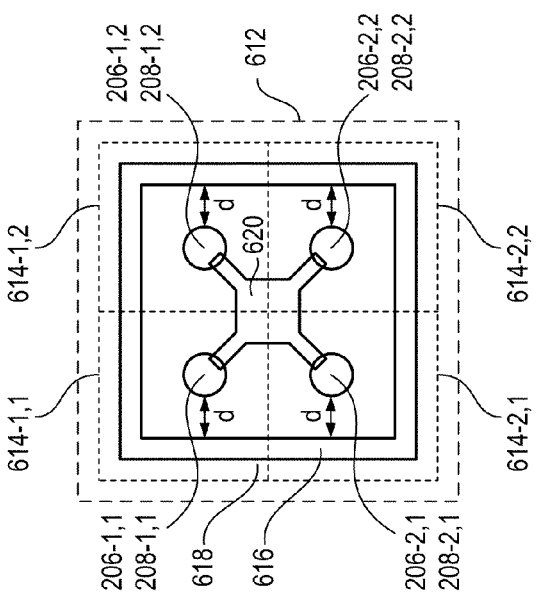
FIG. 6D depicts a schematic diagram of details of a pixel in accordance with a fifth alternative embodiment of the present invention.

FIG. 6D depicts a schematic diagram of details of a pixel in accordance with a fifth alternative embodiment of the present invention. Pixel 636 comprises APDs 638 and 640. APD 638 comprises device region 208-1 and APD 640 comprises device region 208-2. Device regions 208-1, 208-2, and diffusion sink 644 are formed by diffusing a suitable dopant through diffusion windows 206-1, 206-2, and 642, respectively. Diffusion window 206-1 and diffusion window 642 are separated by a minimum distance equal to d1, while diffusion window 206-2 and diffusion window 642 are separated by a minimum distance equal to d2. Electrical contacts to APDs 638 and 640 are not shown for clarity. In similar fashion to APDs 622 and 626, described above and with respect to FIG. 6C, the breakdown voltages of APDs 638 and 640 are controlled to be different by the different minimum separations between diffusion window 642 and diffusion windows 206-1 and 206-2, respectively.

It is to be understood that the disclosure teaches just one example of the illustrative embodiment and that many variations of the invention can easily be devised by those skilled in the art after reading this disclosure and that the scope of the present invention is to be determined by the following claims.

What is claimed is:
1. A method comprising:
    determining a first desired diffusion depth to which a dopant is to be diffused through a first diffusion window, at a first location, into a semiconductor layer;
    determining a first attribute for a second diffusion window located at a second location, wherein the first attribute is based on the first desired diffusion depth and a pre-established relationship between the diffusion depth at the first location and the first attribute for the second diffusion window;
    forming a diffusion mask over the semiconductor layer, wherein the diffusion mask comprises the first diffusion window and the second diffusion window, and wherein the second diffusion window is characterized by the first attribute; and diffusing the dopant into the semiconductor layer through the first diffusion window and the second diffusion window, wherein the dopant is diffused through the first diffusion window to substantially the first desired diffusion depth.

2. The method of claim 1 wherein the first attribute is determined as a width of the second diffusion window.

3. The method of claim 1 wherein the first attribute is determined as a separation distance between the first diffusion window and the second diffusion window.

4. The method of claim 1 further comprising:
determining a second desired diffusion depth to which the dopant is to be diffused through a third diffusion window, at a third location, into the semiconductor layer;
determining a second attribute for a fourth diffusion window located at a fourth location, wherein the second attribute is based on the second desired diffusion depth; and
diffusing the dopant into the semiconductor layer through the third diffusion window and the fourth diffusion window, wherein the dopant is diffused through the third diffusion window to substantially the second desired diffusion depth;
wherein the diffusion mask is formed such that the diffusion mask further comprises the third diffusion window and the fourth diffusion window.

5. The method of claim 4 wherein the diffusion mask is formed such that the second diffusion window and fourth diffusion window collectively define a continuous diffusion window.

6. The method of claim 4 wherein the diffusion mask is formed such that the second diffusion window and fourth diffusion window are the same diffusion window.

7. The method of claim 4 wherein the first desired diffusion depth is determined based on a first desired breakdown voltage for a first APD and the second desired diffusion depth is determined based on a second desired breakdown voltage for a second APD.

8. The method of claim 7 wherein the first desired breakdown voltage and the second desired breakdown voltage are equal.

9. The method of claim 1 further comprising determining the size of the first diffusion window based on the first desired diffusion depth.

10. The method of claim 1 wherein the diffusion mask is formed such that the second diffusion window is an annulus that surrounds the first diffusion window.

11. A method comprising:
determining a first desired breakdown voltage for an APD, wherein the APD comprises a device region formed in a semiconductor layer;
determining a desired diffusion depth for a dopant in the device region, wherein the desired diffusion depth is based on the desired breakdown voltage;
forming a diffusion mask over the semiconductor layer, wherein the diffusion mask comprises;
a plurality of first diffusion windows for forming a plurality of device regions in the semiconductor layer; and
a second diffusion window for forming a diffusion sink, wherein the second diffusion window comprises a plurality of window regions, and wherein each pair of first diffusion windows of the plurality of first diffusion windows is interposed by a window region of the plurality of window regions, and further wherein each of the plurality of window regions is characterized by an attribute that is based on the desired diffusion depth and a pre-established relationship between diffusion depth in a first portion of a diffusion region comprising the first portion and a second portion that is characterized by the first attribute; and diffusing the dopant into the semiconductor layer at each of the plurality of first diffusion windows and the second diffusion window, wherein the dopant is diffused into the semiconductor layer to substantially the desired diffusion depth at each of the plurality of first diffusion windows.

12. The method of claim 11 further comprising:
selecting the attribute as a size of the window region; and
forming the diffusion mask such that each of the plurality of window regions is characterized by the size.

13. The method of claim 11 further comprising:
selecting the attribute as a first separation between each of the first diffusion windows and the second diffusion window; and
forming the diffusion mask such that each of the first diffusion windows is separated from the second diffusion window by the first separation.

14. The method of claim 13 wherein the diffusion mask is formed such that the second diffusion window surrounds each of the first diffusion windows.

15. The method of claim 14 wherein the diffusion mask is formed such that the second diffusion window surrounds each of the first diffusion windows with a uniform separation that is substantially equal to the first separation.

16. A method comprising:
determining a first desired diffusion depth to which a dopant is to be diffused into a semiconductor layer to form a first device region of a first APD characterized by a first desired breakdown voltage;
determining a second desired diffusion depth to which the dopant is to be diffused into the semiconductor layer to form a second device region of a second APD characterized by a second desired breakdown voltage;
forming a diffusion mask over the semiconductor layer, wherein the diffusion mask comprises;
a first pixel, wherein the first pixel comprises a first mask region that separates a first open region and a second open region that surrounds the first open region, and wherein at least a portion of the first mask region has a first minimum width that is based on (1) the first desired diffusion depth and (2) a first pre-established relationship between diffusion depth in a first portion of a diffusion region and the separation distance between the first portion and a second portion of the diffusion region; and
a second pixel, wherein the second pixel comprises a second mask region that separates a third open region and a fourth open region that surrounds the third open region, and wherein at least a portion of the second mask region has a second minimum width that is based on (1) the second desired diffusion depth and (2) the first pre-established relationship; and
diffusing the dopant into the semiconductor layer at the first open region and the third open region, wherein the dopant is diffused to substantially the first desired diffusion depth at the first open region, and wherein the dopant is diffused to substantially the second desired diffusion depth at the third open region.

17. The method of claim 16 further comprising:
- selecting the first desired breakdown voltage and the second desired breakdown voltage as the same breakdown voltage; and
- forming the diffusion mask such that the first minimum width and the second minimum width are substantially equal.

18. The method of claim 16 wherein the diffusion mask is formed such that the second open window has a width that is based on (1) the first desired diffusion depth and (2) a second pre-established relationship between diffusion depth in a third portion of the diffusion region and width of a fourth portion of the diffusion region.

19. The method of claim 18 wherein the diffusion mask is formed such that the fourth open window has a width that is based on (1) the second desired diffusion depth and (2) the second pre-established relationship.

* * * * *